United States Patent [19]

Signore et al.

[11] Patent Number: 5,319,370
[45] Date of Patent: Jun. 7, 1994

[54] ANALOG-TO-DIGITAL CONVERTER WITH A CONTINUOUSLY CALIBRATED VOLTAGE REFERENCE

[75] Inventors: Bruce D. Signore; Eric J. Swanson, both of Austin, Tex.

[73] Assignee: Crystal Semiconductor, Inc., Austin, Tex.

[21] Appl. No.: 937,642

[22] Filed: Aug. 31, 1992

[51] Int. Cl.$^5$ .............................................. H03M 1/10
[52] U.S. Cl. .................................... 341/120; 341/121; 341/143; 341/155
[58] Field of Search ............... 341/120, 155, 118, 143, 341/121

[56] References Cited

U.S. PATENT DOCUMENTS

| | | | |
|---|---|---|---|
| 4,709,225 | 11/1987 | Welland et al. | 340/347 |
| 4,943,807 | 7/1990 | Early et al. | 341/120 |

OTHER PUBLICATIONS

Bang-Sup Song & Paul R. Gray, "A Precision Curvature-Compensated CMOS Bandgap Reference", *IEEE J. Solid State Circuits*, vol. SC-18, No. 6, Dec. 1983.
C. R. Palmer & R. C. Dobkin, "A Curvature-Corrected Micropower Voltage Reference", *ISSCC Digest*, Feb. 1981.
P. Holloway, "A Trimless 16b Digital Potentiometer", *ISSCC Digest*, Feb. 1984, pp. 66-67, 320-321.
G. McGlinchy, "A Monolithic 12b 3uS ADC", *ISSCC Digest*, Feb. 1983, pp. 80-81.
H. Lee, D. A. Hodges & P. R. Gray, "A Self-Calibrating 12b 12uS CMOS", *ISSCC Digest*, Feb. 1984, pp. 64-65.
B. Harvey, "A Monolithic 12b System DAC", *ISSCC Digest*, Feb. 1983, pp. 182-183, 306.
B. M. J. Kup, E. C. Dijkmans, H. Naus and J. Sneep, "A Bit Stream Digital-to-Analog Converter with 18b Resolution", *ISSC Digest*, Feb. 1991, pp. 70-71, 293.

Primary Examiner—Sharon D. Logan
Attorney, Agent, or Firm—Gregory M. Howison

[57] ABSTRACT

A method and apparatus for calibration of errors in the analog reference voltage input of an analog-to-digital converter. A monolithic reference voltage generator is provided to generate the analog reference which includes a bandgap voltage reference (50) that outputs an untrimmed voltage and a temperature voltage. The untrimmed voltage and temperature voltage are input to a delta-sigma A/D converter (52) which has the output thereof processed through a digital filter (54) to output data on a data bus (58) for storage in an EEPROM (60). The EEPROM (60) is operable in one mode to store temperature history data and, in another mode, to store temperature compensation data. In one mode, temperature compensation parameters are retrieved from the EEPROM (60) and utilized by a multiplier/accumulator circuit (74) to generate compensation factors which are output as a digital word to a DAC (76) for controlling a trim circuit (14). The trim circuit (14) provides a temperature compensation for the output of the bandgap voltage reference (50). The system is operable in a calibration mode to measure temperatures during a burn-in procedure and calculate necessary information to determine compensation factors and store these in the EEPROM (60). This temperature data is extracted from the EEPROM (60) and output to a serial I/O port (64), compensation factors determined and then stored back in the EEPROM (60). The delta-sigma A/D converter (52) in the run mode then makes temperature measurements for use by the multiplier/accumulator circuit (74) in determining the appropriate compensation data to extract from the EEPROM (60) to trim the output of the bandgap voltage reference circuit (50).

14 Claims, 13 Drawing Sheets

ANALOG-TO-DIGITAL CONVERTER WITH A CONTINUOUSLY CALIBRATED VOLTAGE REFERENCE

TECHNICAL FIELD OF THE INVENTION

The present invention pertains in general to analog-to-digital converters and more particularly, to a method for calibrating a voltage reference associated with the analog-to-digital converter as a function of temperature.

CROSS REFERENCE TO RELATED APPLICATION

This application is related to U.S. patent application Ser. No. 07/937,993, entitled "Method and Apparatus for Calibration of a Monolithic Voltage Reference" filed concurrently herewith.

BACKGROUND OF THE INVENTION

Historically, analog-to-digital converters have been implemented both with and without voltage or current references. G. McGlinchy, *A Monolithic 12b 3uS ADC*, ISSCC Digest, February 1982, pp. 80–81 and H. Lee, D. A. Hodges and P. R. Gray, *A Self-Calibrating 12b 12uS CMOS*, ISSCC Digest, February 1984, pp. 64–65. Digital-to-analog converters, on the other hand, are mostly implemented with on-chip references. B. Harvey, A Monolithic 12b System DAC, ISSCC Digest, February 1983, pp. 182–183, 306 and B. M. J. Kup, E. C. Dijkmans, H. Naus and J. Sneep, *A Bit Stream Digital-to-Analog Converter with 18b Resolution*, ISSCC Digest, February 1991, pp. 70–71, 293. In general, all existing converters contain an untrimmed or a "one-time" trimmed reference. After a final trim has been performed, any drift of the reference relative to time or temperature will result in reduced performance of the specifications of the converter.

Traditional voltage references have utilized analog techniques to trim the output voltage of the reference to eliminate drift with temperature. This technique is referred to as "curvature compensation" and it appears widely in published literature. For example, such techniques are disclosed in Bang-Sup Song and Paul R. Gray, *A Precision Curvature-Compensated CMOS Bandgap Reference*, IEEE J. Solid State Circuits, Vol. SC-18, No. 6, December 1983 and C. R. Palmer and R. C. Dobkin, *A Curvature-Corrected Micropower Voltage Reference*, ISSCC Digest, February 1981. Both of these articles are incorporated herein by reference. In general, a bandgap reference is the conventional analog voltage reference that is utilized. This type of analog reference is made up of the sum of a bipolar device's base-emitter voltage, $V_{be}$, which has a negative temperature co-efficient and a thermal voltage, $V_{th}$, which thermal voltage has a positive temperature co-efficient. The subtraction of the base-emitter voltages of two bipolar devices operating at different current densities will provide this thermal voltage. The values of $V_b$ and $V_{th}$ must be scaled appropriately to cancel out to first-order accuracy the temperature co-efficient of the entire circuit. To reduce temperature drift to even lower levels requires a second or third order compensation.

The primary disadvantage with respect to conventional temperature compensation techniques is that these operations are performed in the analog domain utilizing analog temperature curvature compensation techniques. The voltage $V_{th}$ is a linear voltage that is Proportional to Absolute Temperature (PTAT) wherein the base-emitter voltage is a polynomial which has some second and/or third order terms and therefore varies with temperature. When the voltage $V_{be}$ is linearized with respect to temperature, the following equation results:

$$V_{OUT} = V_{be} + KV_T + FV_T^2 + GV_T^3 + \ldots \quad (1)$$

It can be seen that the constants K, F and G in Equation 1 are analog "real" number "quantities" as opposed to digital "integer" values. These quantities must be scaled and summed together such that the resultant voltage is insensitive to temperature changes. Since all scaling and summation is done in the analog domain, the circuits are highly sensitive to processing uncertainties and time drifts. Predominantly, laser trimmed resistors are utilized to adjust the temperature performance of the reference. Since the reference is packaged after the trimming is complete, post-calibration shifts are common due to piezo-electric effects caused by post-package stress.

SUMMARY OF THE INVENTION

The present invention disclosed and claimed herein comprises a monolithic analog-to-digital converter. The monolithic analog-to-digital converter includes a primary analog-to-digital converter for receiving an analog input signal and providing a digital output signal that corresponds to the analog input. An analog environmental parameter measuring device is provided for measuring predetermined environmental parameters associated with the primary analog-to-digital converter. The measuring device is operable to generate an analog environmental signal corresponding to the measured environmental parameters. A secondary analog-to-digital converter is operable to convert the analog environmental information to digital information. A non-volatile memory is operable to store digital compensation parameters associated with the digital environmental information. A compensation device is operable to access select ones of the digital compensation parameters from the memory corresponding to the digital environmental information output by the secondary analog-to-digital converter. The compensation device is operable to process the select digital compensation parameters in accordance with a predetermined compensation algorithm and compensate the operation of the primary analog-to-digital converter in accordance therewith.

In another aspect of the present invention, calibration circuitry is provided for determining the compensation parameters stored in the non-volatile memory. A calibration mode is entered, and during the calibration mode, select operating parameters of the primary analog-to-digital converter are measured as a function of the predetermined environmental parameters. The results of this measurement are logged into the non-volatile memory for storage therein. These parameters are utilized to calculate the compensation parameters that are stored in the non-volatile memory during a run mode.

In another aspect of the present invention, the operating parameters of the analog-to-digital converter that are compensated comprise the analog reference voltage input to the primary analog-to-digital converter. An analog reference voltage generator is provided for generating the reference voltage. A trim circuit is provided for compensating the output of the reference voltage generator to provide the analog reference input to the primary analog-to-digital converter. The compensation device includes a compensation processor for accessing the select ones of the compensation parameters and processing them in accordance with the predetermined compensation algorithm to generate a digital compensation word. The compensation device is operable to perform the compensation on the output of the analog reference voltage generator.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
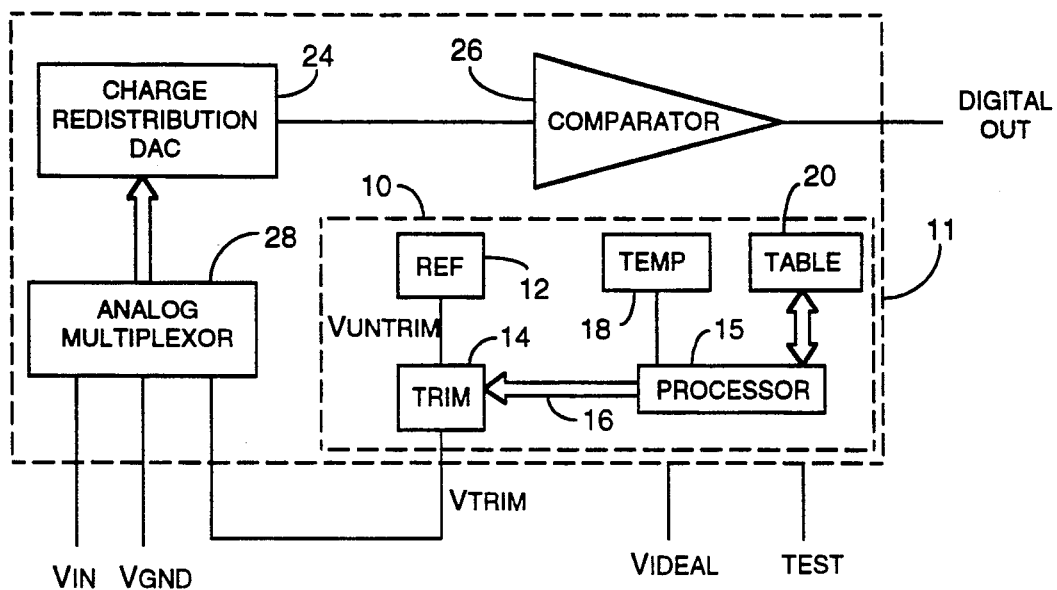
FIG. 1 illustrates an overall block diagram of the analog-to-digital converter with associated circuitry for trimming the analog reference.

Referring now to FIG. 1, there is illustrated a block diagram of the analog-to-digital converter with associated circuitry for trimming an internal analog reference. The analog-to-digital converter is a monolithic circuit that includes both circuitry to provide the conversion from an analog domain to a digital domain and also includes an on-chip curvature compensated analog reference voltage. The analog reference voltage generator is defined by a block 10 and the primary converter is defined by a block 11. The analog reference voltage generator includes an untrimmed monolithic analog reference 12 that outputs a voltage $V_{UNTRIM}$. The voltage $V_{UNTRIM}$ is input to a trim circuit 14 that receives on a digital bus 16 a digital trim command word. This digital trim command word is input to an internal digital-to-analog converter (DAC) to control the operation of the trim circuit 14. The output of the trim circuit 14 is the curvature compensated analog voltage $V_{TRIM}$.

The digital trim command word on bus 16 is generated by a digital processing circuit 15. The digital processing circuit 15 receives as one input a temperature measurement from a temperature measurement device 18. This is utilized in conjunction with calibration parameters stored in a lookup table 20 to generate the digital trim command word for output on the digital bus 16. It is important to note that the temperature measurement circuit 18 is integral to the analog reference 12 and the remaining blocks on the chip such that a direct temperature measurement is made of the voltage $V_{UNTRIM}$. This is compared with a system that would utilize an external temperature measurement device and input this temperature measurement on an external pin.

The primary analog-to-digital converter 11 is a successive approximation type converter. It consists of a charge redistribution digital-to-analog converter (DAC) 24 with the digital output thereof connected to a comparator 26 to provide a digital output. An analog signal multiplexor 28 is operable to receive the analog input voltage $V_{IN}$, a ground voltage $V_{GND}$ and the voltage $V_{TRIM}$. The voltage $V_{TRIM}$ is output from the trim circuit 14 and from the chip such that this voltage is provided external to the circuit. This is then tied back into the input of the analog multiplexer 28. The output of the analog multiplexer 28 is input to the charge redistribution DAC 24. This converter is substantially the same type that is disclosed in U.S. Pat. No. 4,709,225, entitled *Self-Calibration Method for Capacitors in a Monolithic Integrated Circuit*, which patent is incorporated herein by reference. As will be described hereinbelow, the reference block 10 includes a secondary analog-to-digital converter that is utilized to continuously monitor the voltage reference 12 and provide a trimming operation. This secondary converter is utilized in order to maximize the throughput of the primary converter because it now does not have to monitor the reference voltage while it converts the external analog input signal.

In operation, calibration parameters are stored in lookup table 20 and then, during running of the converter 11, the temperature is measured and input to the digital processing circuit 15, and parameters corresponding to that temperature measurement are retrieved from the lookup table 20 and utilized in the digital processing algorithm of the digital processing circuit 15. As will be described hereinbelow, the method of correcting the temperature drift of the voltage $V_{UNTRIM}$ utilizes a digital method based on a digital polynomial curve-fitting algorithm.

A calibration operation is also provided in the circuit for automatically measuring the temperature parameters of the analog reference 12 as a function of temperature. As will be described in more detail hereinbelow, the overall chip is disposed in a temperature environment and allowed to traverse from a high temperature to a low temperature. A TEST signal is then input to the chip to place it in the Test Mode. In this mode, the temperature measurement device 18 is operable to control the processor 15 to store in the table 20 logging data associated with the analog reference 12 during the traversal of the temperature range of interest in the calibration mode. In the preferred embodiment, this logging data is then extracted through a serial I/O port (not shown), processed to determine calibration parameters and then calibration parameters stored back into the Table 20. During a Run operation, the processor 15 is operable to retrieve the calibration parameters from Table 20, process them in accordance with a predetermined compensation algorithm and output the appropriate digital compensation word on the digital bus 16.

The data logging operation is important, as this allows any type of integrated circuit to automatically measure its own parameters during the traversal of a temperature range and store these parameters for later retrieval. This is to be compared with conventional systems that require external voltages to be input at a particular temperature, data output therefrom and stored external to the chip. For large production runs of high volume parts, this is not a feasible method of data logging, since these parts are typically disposed in large quantities on test boards in a densely packed manner. The system of the present invention allows the part to internally generate, calculate and store the necessary data to effect the data logging operation.

Additionally, during the run operation, the analog voltage $V_{TRIM}$ is output for the purpose of providing to a vendor the actual trimmed analog voltage. This allows the vendor or user of the part to measure the voltage to determine how well the voltage is compensated. However, the operation of the system does not require this voltage to be output. Alternatively, the processor 15 could measure the output of the analog reference 12, determine the necessary compensation parameters that would be required to operate the overall analog-to-digital converter and then compensate the output of the analog-to-digital converter at another place in the signal chain. For example, a digital compensation signal could be input directly to the charge distribution DAC 24. It is not necessary to trim the analog reference. Rather, it is only necessary to insure that the digital output is compensated for any variations in the reference voltage, which reference voltage must be input to the analog multiplexer 24, which input could occur internally. Therefore, it is necessary to measure the analog reference to determine the operation thereof as a function of temperature and then determine what compensation parameters are necessary in order to compensate for temperature variations of the analog reference.

Figure 1A:
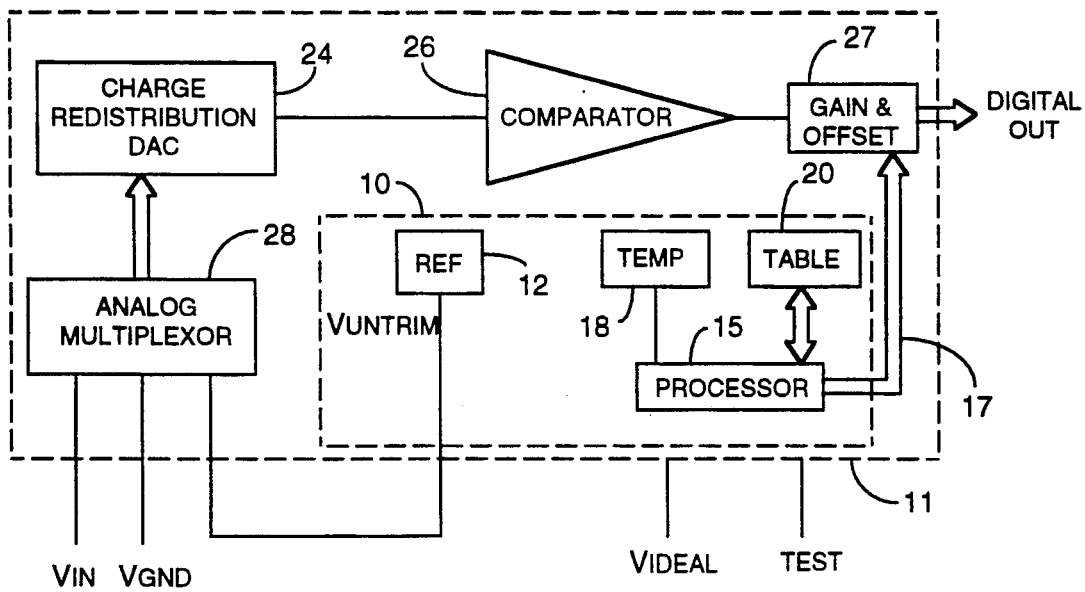
FIG. 1a illustrates an alternate embodiment of the invention of FIG. 1 utilizing compensation in the digital domain.

Referring now to FIG. 1a, there is illustrated an alternate embodiment of the circuit of FIG. 1. In FIG. 1a, a digital gain and offset circuit 27 is provided which is operable to receive a digital compensation word on a bus 17 from the processor 15. In this embodiment, the voltage of $V_{UNTRIM}$ is input directly to the analog multiplexer 28 and the correction is done in the gain and offset circuit 27 in the digital domain. The offset calibration would be similar to that disclosed in U.S. Pat. No. 4,943,807, issued to Early, et al. on Jul. 24, 1990, and entitled "Digitally Calibrated Delta-Sigma Analog-to-Digital Converter", which patent is incorporated herein by reference.

In operation, the calibration procedure would consist of measuring the voltage $V_{UNTRIM}$ as a function of temperature, as described hereinbelow, in addition to the temperature value as the part traverses temperature between high and low temperature values. This information would then be output through a serial I/O port (not shown), processed and the digital values for use with the gain and offset correction circuit 27 determined. These are then stored in the Table 20 and utilized by the processor 15 to generate the digital values for output on the bus 17.

Figure 2:
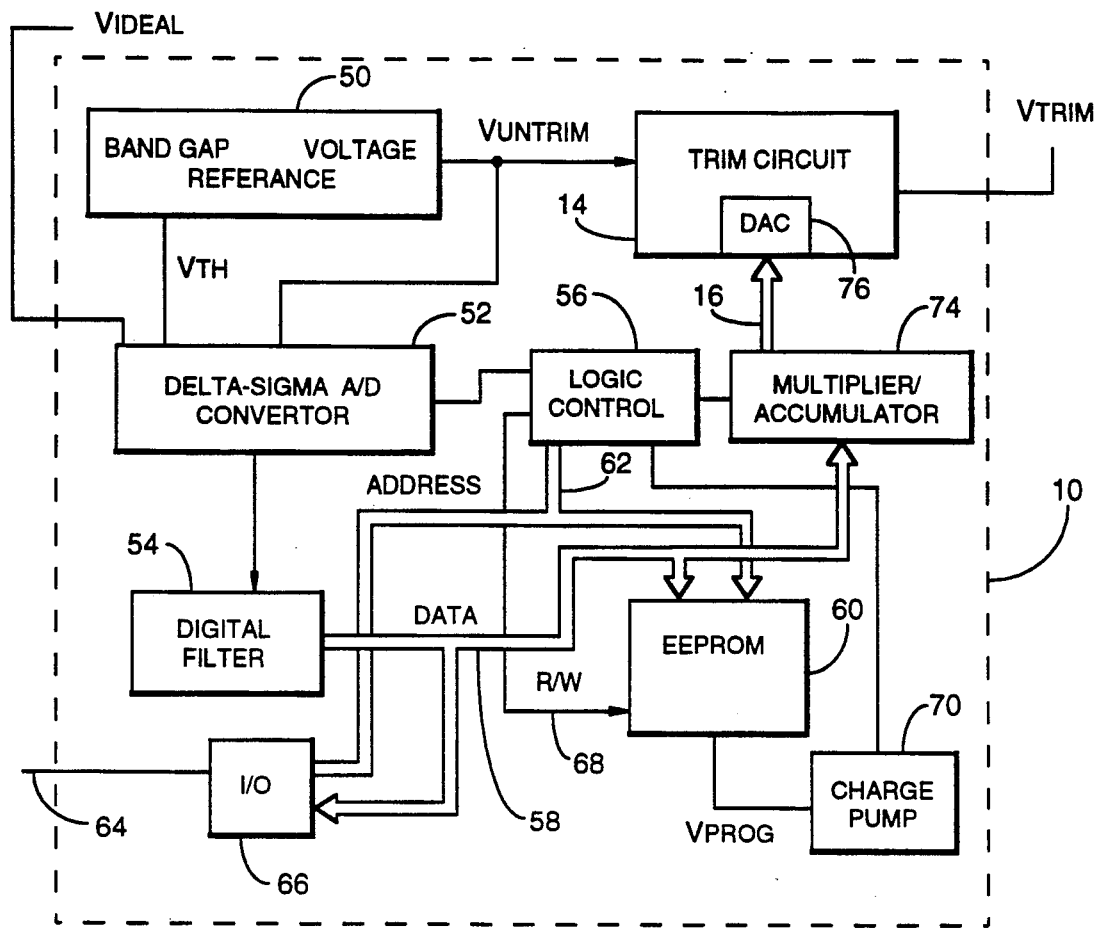
FIG. 2 illustrates a more detailed block diagram of the preferred embodiment for trimming the analog reference.

Referring now to FIG. 2, there is illustrated a more detailed block diagram of the monolithic voltage reference 10 of FIG. 1. The untrimmed analog reference 12 is realized with a bandgap voltage reference 50 in the preferred embodiment. However, this may be any type of zener, buried zener, etc. The bandgap voltage reference 50 is first order compensated, the absolute value of the reference not being critical due to the trimming operation of the trim circuit 14. The bandgap voltage reference 50 is operable to output the analog reference voltage $V_{UNTRIM}$, which basically is the sum of the $V_{be}$ of a bipolar transistor summed with a PTAT correction voltage $KV_T$ to the $V_{be}$ to cancel out the linear temperature variation of $V_{be}$, i.e. a first order compensation. After the PTAT correction voltage is added, the voltage $V_{UNTRIM}$ will exhibit mostly quadratic temperature variations. The circuitry utilized to realize this circuit is conventional, as described in the Bang-Sup Song reference, incorporated herein by reference. One aspect of a bandgap reference circuit is that the PTAT thermal voltage can be output, this voltage being the difference between the base-emitter voltage of two bipolar devices operating at different current densities within the bandgap reference. This voltage is labelled $V_{th}$.

Although $V_{th}$ is illustrated as being generated by the bandgap voltage reference 50, it could be generated by another and separate $V_{th}$ generator that is "co-located" with the bandgap reference voltage i.e., either in the same package or on the same substrate. This separate $V_{th}$ generator could be realized with two bipolar devices operating at two different current densities wherein the voltage $V_{th}$ is the difference between the $V_{BE}$ voltages of the two devices.

The voltage $V_{UNTRIM}$ and $V_{th}$ are input to a delta-sigma A/D converter 52. The A/D converter can be of any order, second, third, fourth, . . . , and have any topology, single loop, multi-loop, multi-bit, . . . . The A/D converter 52 of the preferred embodiment is implemented in silicon as a second-order charge redistribution delta-sigma converter. This is similar to the delta-sigma converter topology described in U.S. Pat. No. 4,943,807, issued to Early, et al., and entitled, "Digitally Calibrated Delta-Sigma Analog-to-Digital Converter", which patent is incorporated herein by reference. The delta-sigma A/D converter 52 includes a second order modulator which is comprised of a one-bit analog-to-digital converter imbedded in an analog feedback loop (including a comparator) with high, open loop gains. The analog input signal comprises the untrimmed output of the bandgap reference voltage 50, $V_{UNTRIM}$. The output of the comparator in the delta-sigma A/D converter 52 drives a one-bit DAC consisting of a set of switches connected to a positive or negative reference voltage. The DAC output signal keeps the charge on the integrating capacitor close to zero. The duty cycle of the comparator's output thus represents the value of the analog input. The sampling frequency of the delta-sigma A/D converter 52 is 327.68 kHz. However, it should be understood that although a one-bit DAC is utilized, a higher order output level could be utilized.

The output of a delta-sigma A/D converter 52 is input to a digital filter 54. The digital filter 54 is a Finite Impulse Response type digital filter which converts the high-speed, low-resolution, one-bit comparator output into a low frequency, 16-bit resolution output. The dynamic range of the delta-sigma A/D converter 52 and the digital filter 54 combination is greater than 90 dB. The output word rate of the filter is 5 Hz. The delta-sigma A/D converter 52 is controlled by a logic control circuit 56 to select the inputs $V_{th}$ and $V_{UNTRIM}$, in addition to an external ideal voltage, $V_{IDEAL}$, which is multiplexed as an input to the delta-sigma A/D converter 52, and ground. These voltages are utilized to perform the polynomial curve-fitting algorithm as will be described in more detail hereinbelow.

The digital filter 54 has the output thereof connected to a digital data bus 58 that is input to an Electrically Erasable and Programmable Read Only Memory (EEPROM). The EEPROM 60 is utilized to store the various parameters necessary to, in one mode, measure the parameters, and in another mode, store final calibration parameters, as will be described in more detail hereinbelow. The EEPROM 60 receives as an address input from an address bus 62, addresses that are generated from the logic control circuit 56. Additionally, addresses can be received external to the chip on a serial port 64, which is input to an I/O circuit 66. The I/O circuit 66 interfaces with the address bus 62 and also with the data bus 58. As will be described hereinbelow, during a calibration mode, data is stored in the EEPROM 60 to calibrate the voltage reference generator 10 at multiple temperature points. This information is extracted from the EEPROM in a final test, final correction parameters are calculated and then stored in the EEPROM 60 for utilization during running of the chip. However, as also will be described hereinbelow, all of this operation could be performed on chip.

During programming of the EEPROM, data must be permanently stored in the EEPROM 60, as this is a non-volatile memory. This is achieved with the use of a Read/Write signal (R/W) that is received on a line 68 and interfaces with the logic control circuit 56. Although not shown, this R/W signal line 68 is also interfaced external to the chip. The programming is performed in conjunction with a write operation and a programming voltage. The programming voltage is a conventional voltage that must be disposed at a predetermined level for a predetermined duration of time in order to effectively program the EEPROM 60. This is an inherent aspect of the EEPROM 60. In one embodiment, the programming voltage is derived from an on-chip charge pump 70, which develops the appropriate high voltage necessary to program the chip. However, in the preferred embodiment, the voltage is generated external. The operation of the programming voltage in the charge pump 70 is controlled by logic circuit 56.

The data bus 58 is also connected to a multiplier/accumulator 74, which is also controlled by the logic control circuit 56. The multiplier/accumulator circuit 74 is operable to generate a digital output on the digital bus 16 for input to the trim circuit 14. The multiplier/accumulator circuit 74 can perform 16-bit by 16-bit multiplies and 16-bit additions. It is used to perform slope and intercept calculations in accordance with the following equation:

$$\xi_x = (m_{N-1} \times T_x) + N - 1 \quad (2)$$

This equation will be discussed hereinbelow in more detail.

The trim circuit 14 includes a reference trim DAC 76 which utilizes a resistor-based DAC that acts as a digitally programmable resistor divider. Its primary purpose is to adjust the untrimmed reference voltage $V_{UNTRIM}$ to a value of 3.0 volts. The resolution of the trim DAC is about 50 μV. The reference trim DAC 76 has 16-bits of resolution, although all of the bits are not utilized. Since the worst-case variation of the untrimmed reference voltage, $V_{UNTRIM}$, falls within the 3.4 to 3.8 volt range and will only be trimmed to 3.0 volts, only 15% of its range is utilized. The DNL and INL of this DAC are typically around ¼ LSB. This type of DAC has been described in P. Holloway, A Trimless 16b Digital Potentiometer, ISSCC Digest, February 1984, pp. 66, 67, 320-321, which article is incorporated herein by reference.

Referring now to FIGS. 3a-3e, there are illustrated curves depicting the digital curve fitting operation. With respect to FIG. 3a, there is illustrated a plot of the actual voltage output by the bandgap reference $V_{UNTRIM}$ as compared to the ideal voltage $V_{IDEAL}$. This is a plot of voltage versus temperature. At n points along the curve, $V_{UNTRIM}$ is measured and compared to $V_{IDEAL}$ to evaluate the $\xi_n$'s. This comprises the difference between the $V_{IDEAL}$ curve and the $V_{UNTRIM}$ curve. The temperatures and difference values are stored for future use. As will be described hereinbelow, once the $\xi_n$ is known for a given temperature, it is only necessary to then substract this value from the $V_{UNTRIM}$ value at any given temperature to recover the $V_{IDEAL}$ voltage.

Figure 3A:
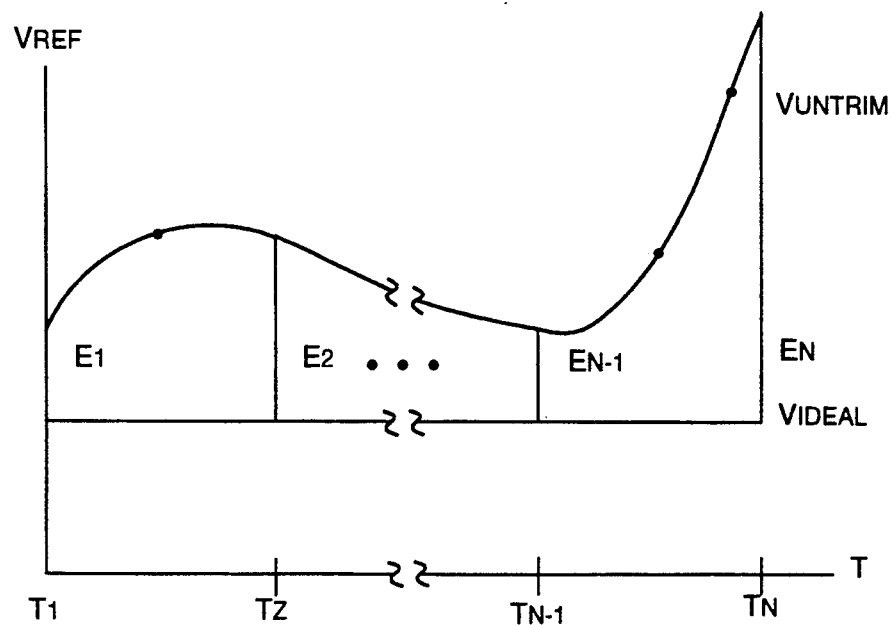
FIGS. 3A–3E illustrate the curve-fitting algorithm utilized in the block diagram of FIG. 2.
Figure 3B:
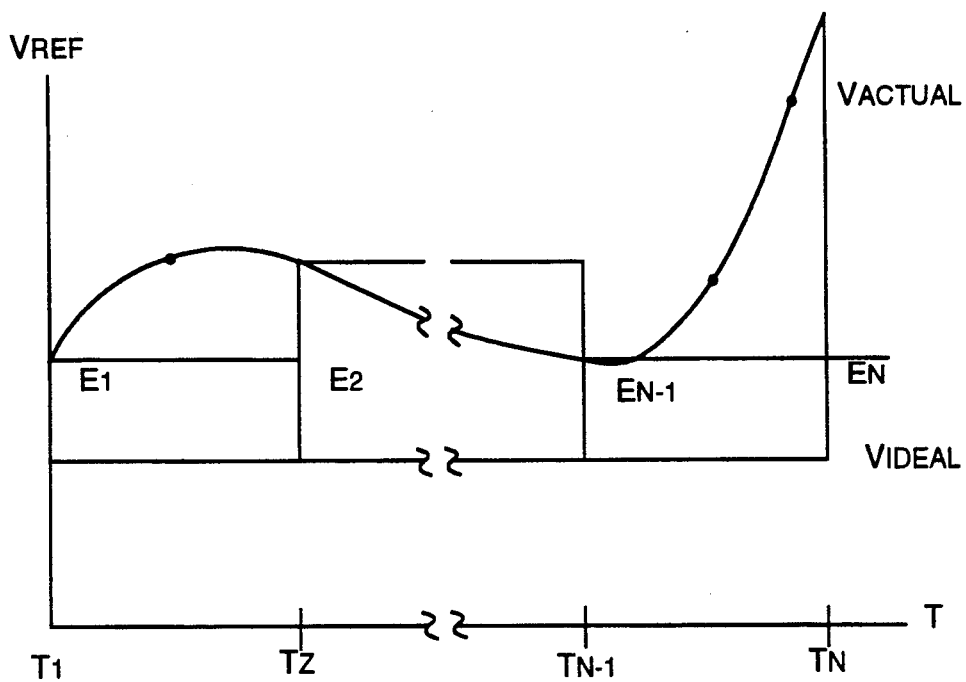
Figure 3C:
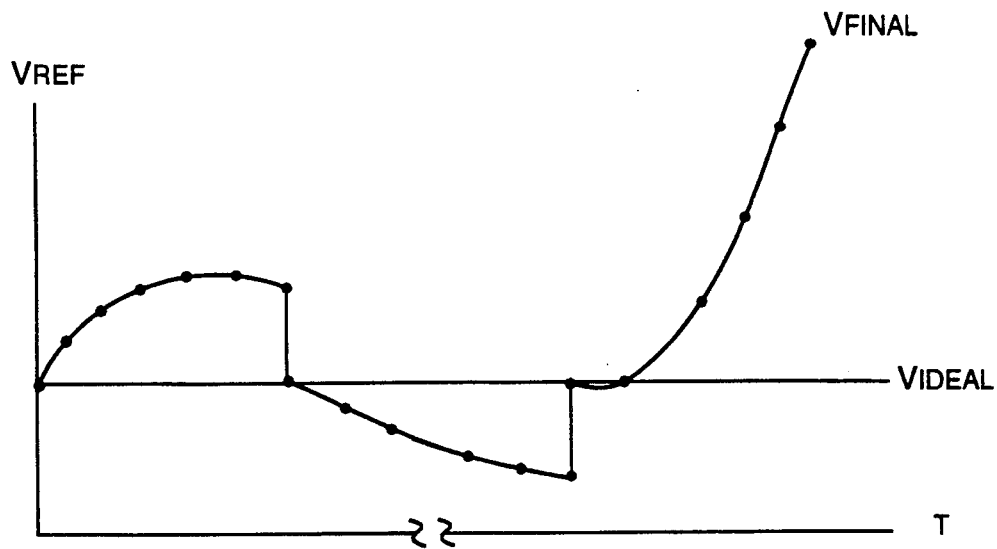

FIG. 3b illustrates a plot of $V_{UNTRIM}$ and $V_{IDEAL}$ for two segments, the first segment and the last segment in a data group. If $T_{N-1} < T_X < T_N$, then $\xi_X = \xi_{N-1}$. This is a rectangular approximation and this is illustrated as an overlay to the curve in FIG. 3b. The result is illustrated in FIG. 3c, wherein each section is level shifted, but not slope adjusted.

Figure 3D:
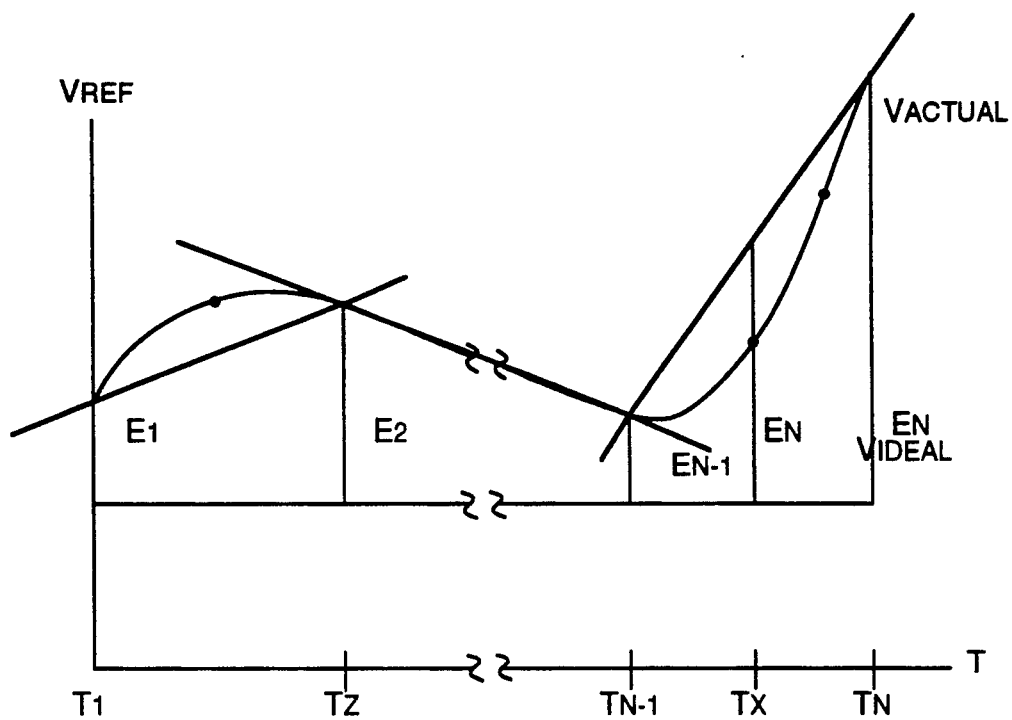

Referring now to FIG. 3d, there is illustrated a more complicated curve fit which involves a trapezoidal approximation of the untrimmed voltage curve. In this method, each of the N−1 segments is interpolated with a linear interpolation algorithm which is performed on the endpoint, and then a slope and intercept calculated for a given segment. For example, the slope $m_1$ is calculated by the equation:

$$m_1 = \frac{(\xi_2 - \xi_1)}{T_2 - T_1)} \quad (3)$$

The y-intercept is calculated by the equation:

$$b_1 = \xi_1 - (m_1 \times T_1) \quad (4)$$

During normal operation, the temperature is continuously monitored and, depending on the temperature, the appropriate segment is located along with its slope intercept. In the example illustrated in FIG. 3d, the temperature $T_x$ between temperatures $T_N$ and $T_{N-1}$, and a new difference voltage $\xi_x$ is calculated by the equation:

$$\xi_x = m_{N-1} \times T_x + b_{N-1} \quad (5)$$

Figure 3E:
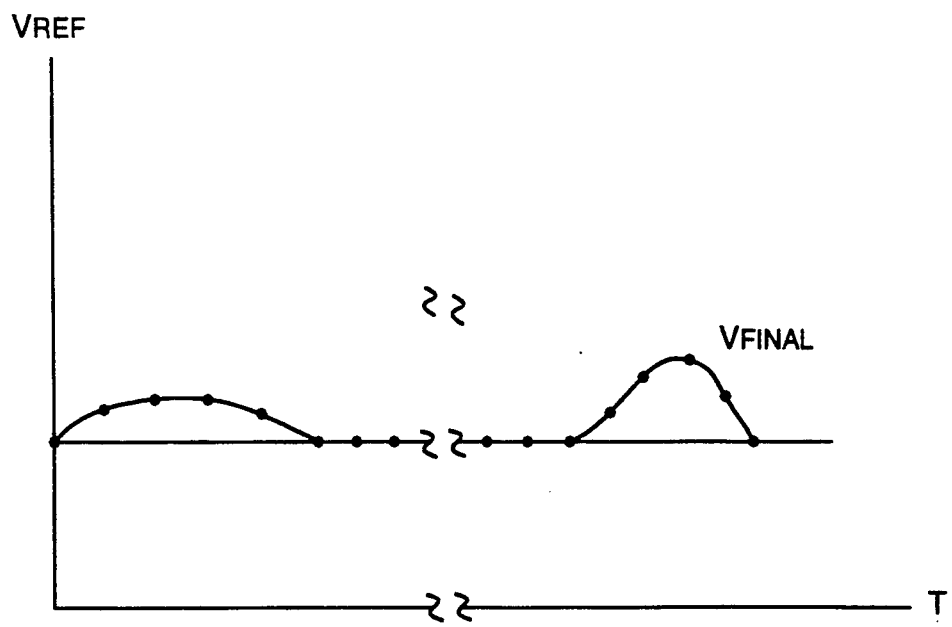

$\xi_x$ is then subtracted from the untrimmed reference voltage, resulting in the ideal voltage $V_{IDEAL}$. The chip implementation of the present invention contains a reference which uses a trapezoidal approximation to get increased resolution. The result is illustrated in FIG. 3e, which for the trapezoidal approximation technique utilizes the overall formula for each section as follows:

$$y = mx + b \quad (6)$$

Although the trapezoidal approximation has been utilized in the preferred embodiment, the rectangular approximation would also be acceptable. Additionally, a polynomial fit algorithm could also be utilized for other types of higher order method of polynomial curve fittings. Least squares or spline curve fitting could also be utilized. Algorithms of higher complexity will result in a lower sensitivity of the reference voltage to temperature changes. The polynomial fit would utilize the following equation:

$$y = A + Bx + Cx^2 + Dx^3 \cdots \tag{7}$$

It can be seen that in order to perform a sufficient curve fitting to provide an acceptable $V_{TRIM}$ compared to $V_{UNTRIM}$, it is necessary to have a number of points along the temperature baseline. This therefore requires that measurements be taken of the "actual" device over temperature. As will be described hereinbelow, each of these measurements is taken at its respective temperature during a calibration operation which occurs in a burn-in process. This data is stored in the non-volatile memory and then extracted at a later time. At this later time, which in the preferred embodiment is final test, the final calibration parameters are calculated and stored back into the EEPROM 60 for use during the actual operation of the chip. This will be described hereinbelow.

Figure 4:
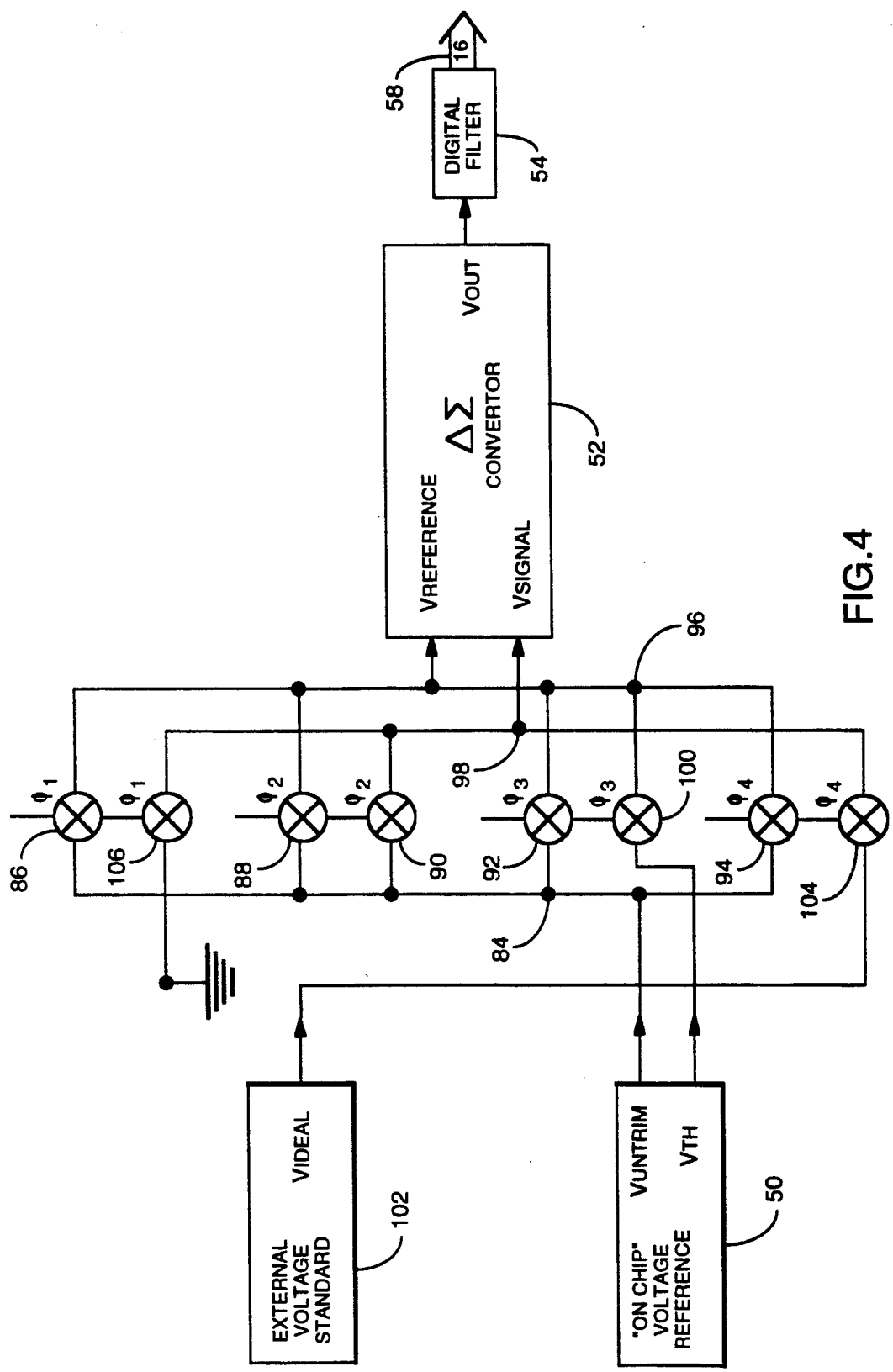
FIG. 4 illustrates a detailed block diagram of the multiplexing scheme for the delta-sigma converter to control the different modes of operation.

Referring now to FIG. 4, there is illustrated a diagrammatic view of the delta-sigma multiplexing scheme, wherein the input of the delta-sigma A/D converter 52 is multiplexed to perform different operations, wherein the $V_{UNTRIM}$, $V_{th}$, $V_{IDEAL}$ and ground voltages are utilized to generate the information necessary to both calibrate the chip and to run the chip. The voltage $V_{UNTRIM}$ is connected to a node 84. Node 84 is connected to the input of switches 86, 88, 90, 92 and 94. Switches 86, 88 and 92 have the other side thereof connected to a node 96 that comprises the $V_{REFERENCE}$ input to the delta-sigma A/D converter 52. The switch 90 has the other side thereof connected to a node 98 and comprises the $V_{SIGNAL}$ input to the delta-sigma A/D converter 52. The $V_{th}$ voltage is connected to one side of a switch 100, the other side thereof connected to a node 98. The voltage $V_{IDEAL}$ is generated from an external voltage standard 102 and the output thereof is connected to one side of the switch 104, the other side of which is connected to the node 98. Ground is connected to one side of a switch 106, the other side thereof connected to node 98.

The switches 86 are controlled by a multiplex control signal $\phi_1$. This is utilized for measuring offset. Switches 88 and 90 are controlled by a multiplex control signal $\phi_2$, which is utilized to measure gain. The switches 92 and 100 are controlled by a multiplex control signal $\phi_3$, which is utilized to measure temperature. Switches 94 and 104 are controlled by a multiplex control signal $\phi_4$, which is utilized to measure voltage. Therefore, the four multiplex control signals $\phi_1 - \phi_4$ provide four modes of operation. During calibration, the offset, gain, temperature and voltage are all measured and utilized to generate the parameters stored in the EEPROM 60. During operation, the temperature is measured. It can be seen that for offset, it is only necessary to compare the voltage $V_{UNTRIM}$ to ground and, for gain, it is only necessary to connect the $V_{REFERENCE}$ input and the $V_{SIGNAL}$ signal of the delta-sigma A/D converter 52 to the $V_{UNTRIM}$ signal. Temperature is measured by inputting the $V_{th}$ signal to the $V_{SIGNAL}$ input and the $V_{UN-TRIM}$ signal to the $V_{REFERENCE}$ input. Voltage is measured by providing as inputs the $V_{IDEAL}$ signal and the $V_{UNTRIM}$ input during calibration.

Figure 4A:
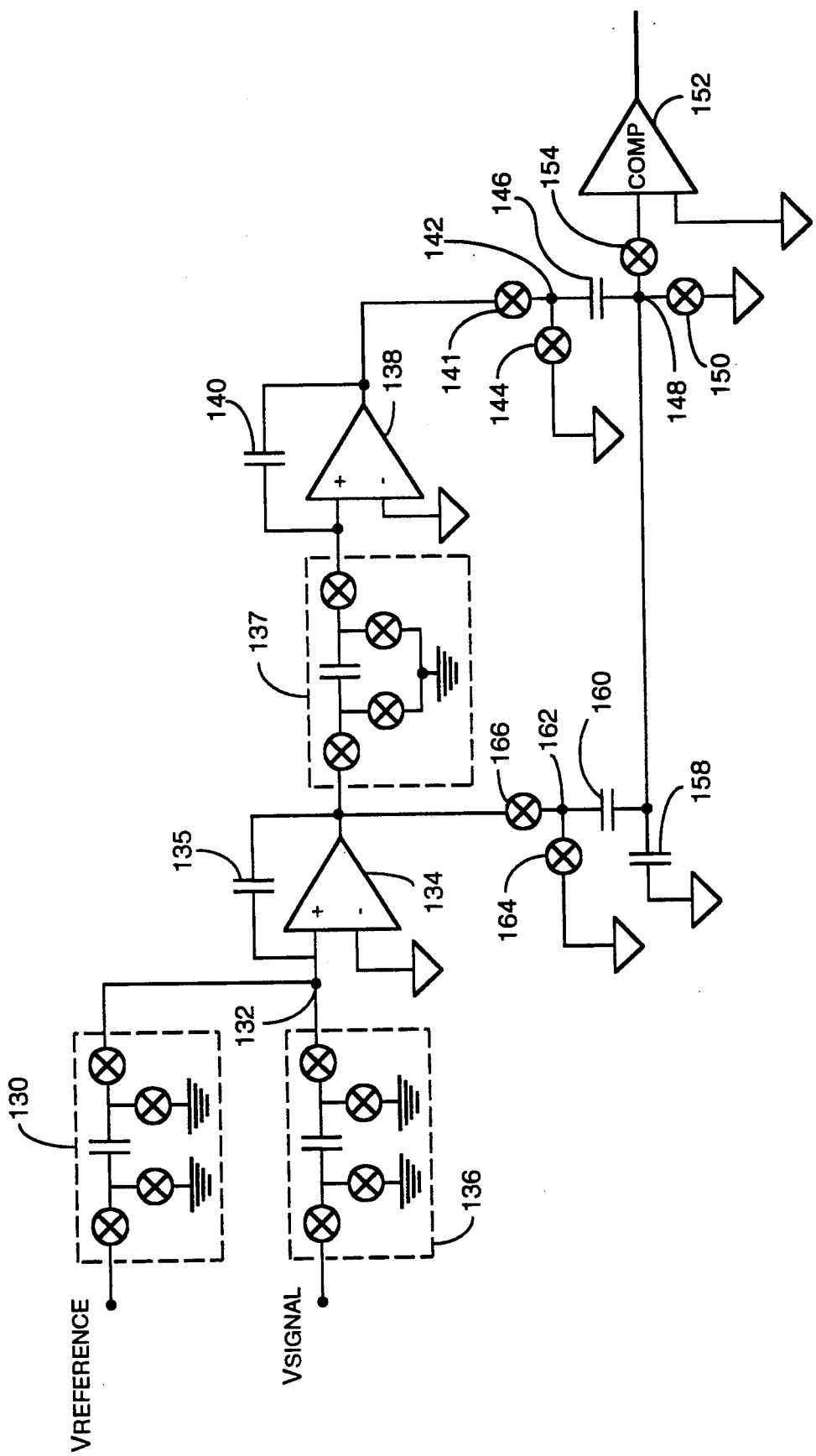
FIG. 4a illustrates a detailed block diagram of the delta-sigma A/D converter.

Referring now to FIG. 4a, there is illustrated a block diagram of the delta-sigma A/D converter 52. The $V_{REFERENCE}$ input is connected to one side of a switched capacitor section 130, the other side of the switched capacitor section 130 is connected to an input node 132, which input node is provided as a positive input of an amplifier 134. Similarly, the $V_{SIGNAL}$ input comprises one side of a switched capacitor section 136, the other side of the switched capacitor section 136 also connected to the node 132. The switched capacitor sections 130 and 136 comprise a conventional switched capacitor section, wherein each side of the capacitor is connected through two separately controlled switches to ground and also to the input and output of switched capacitor section 130. In operation, one side of the capacitor is grounded and the other side is connected to an input signal and, in the second cycle, the other side of the capacitor grounded and the previously grounded side connected to the node 132.

The amplifier 134 has the negative input thereof connected to ground and a feedback capacitor 135 connected between the positive input and the output. The output of the amplifier 134 is connected to one side of a switched capacitor section 137, the other side connected to the positive input of a second stage amplifier 138. The negative input of the amplifier 138 is connected to ground and a feedback capacitor 140 is connected between the positive input and the output of the amplifier 138. The output of the amplifier 138 is connected to one side of a switch 141, the other side of which is connected to a node 142. Node 142 is connected to ground through a switch 144, and also to one side of a capacitor 146. The other side of capacitor 146 is connected to a node 148. Node 148 is connected to ground through a switch 150 and also to the input of a comparator 152 through a switch 154. Comparator 152 comprises the input/output digital stream. The node 148 is also connected through a feedback path to one side of a capacitor 158 and to one side of the capacitor 160. The other side of capacitor 158 is connected to ground and the other side of capacitor 160 is connected to a node 162. Node 162 is connected to ground through a switch 164 and also through the output of amplifier 134 to a switch 166. The switches 140, 144, 150 and 154 and the capacitor 146 comprise a switched capacitor section on the output. The feedback path, comprised of switches 164 and 166 and capacitors 158 and 160, provide one-bit DAC feedback path. This is a conventional operation. The timing for all the switched capacitor sections and switches in general is known and is not described herein.

Figure 5:
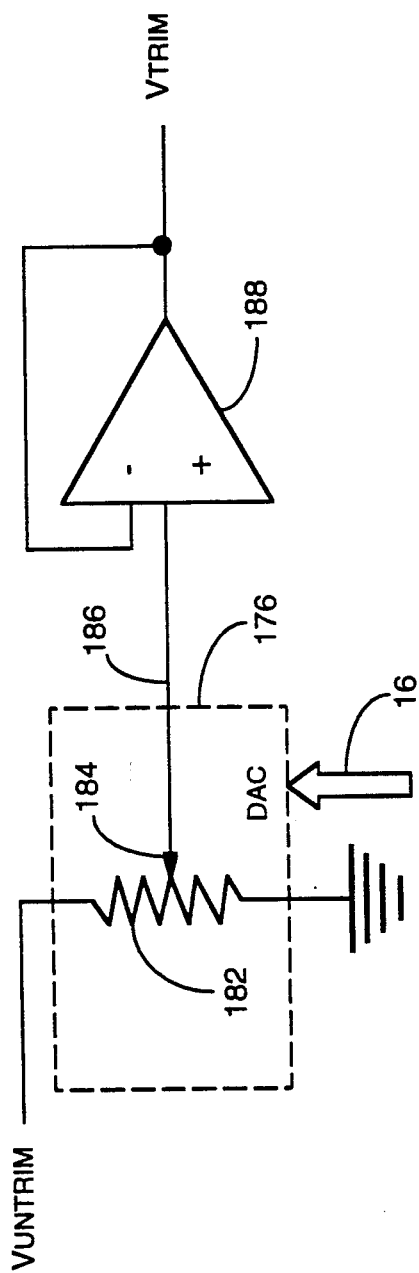
FIG. 5 illustrates a simplified block diagram of the trim circuit and the segmented DAC.

Referring now to FIG. 5, there is illustrated a detailed logic diagram of the trim circuit 14. The voltage $V_{UNTRIM}$ is connected to one side of a multi-tap resistor 182. The other side of the resistor 182 is connected to ground. A wiper 184 is connected to the resistor 182 at any of 65,536 points, which points are each digitally selectable. The other end of this wiper is connected to node 186. The node 186 is connected to one input of an operational amplifier 188 configured as a buffer. The operational amplifier 188 has the negative input thereof connected to the output and the positive input thereof connected to node 186, the operational amplifier providing the drive requirements for the output voltage $V_{TRIM}$ on the output thereof. The reference trim DAC 76 trims the reference by selecting a tap to which the wiper 184 is connected, this new connection point or position determined in response to the digital word received on the digital bus 16. This is similar to the DAC described in P. Holloway, "A Trimless 16B Digital Potentiometer", ISSCC Digest, February 1984, pp. 66, 67, 320-321, which was incorporated herein by reference.

Figure 6:
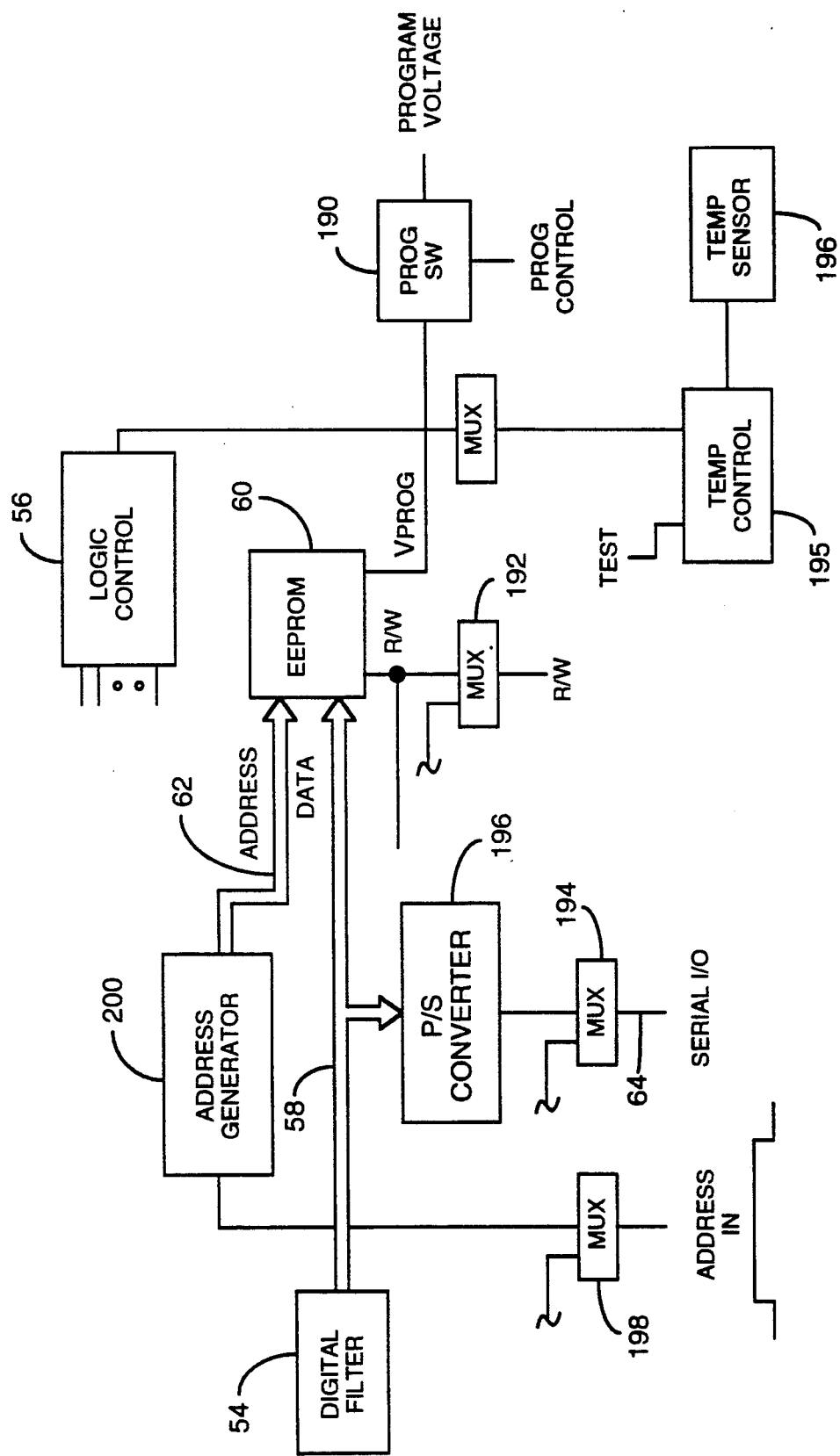
FIGS. 6 and 6A illustrate a block diagram of the programming operation of the E²PROM.

Referring now to FIG. 6, there is illustrated a block diagram of the operation of the EEPROM 60. As described above, the EEPROM 60 is operable to store data internally generated by the chip and also to allow external access to the data for downloading and uploading of data for the calibration procedure and the generation of final digital correction words. Therefore, the EEPROM 60 must be accessible external to the chip. This is facilitated through multiplexing the pins on the chip. Additionally, the program voltage is generated external to the chip, in addition to a program voltage control switch 190. This allows a full program voltage to be input to a $V_{PROG}$ terminal for applying program voltage to the EEPROM 60. The R/W signal is input on a pin that is connected through a multiplexer 192 to the R/W signal of the EEPROM 60. Although not illustrated, there is a Test Pin that, when pulled high, places the multiplexed pins into a test mode to receive signals for testing purposes.

The serial I/O port 64 is connected to one pin and through a multiplexer 194 to a parallel/serial converter 196. The parallel/serial converter 196 is operable to convert serial inputs from the multiplexer 194 to parallel data for output to the data bus 58 and also to convert parallel data from the bus 58 for output to the serial I/O bus 64. Additionally, address information is received on a pin that is multiplexed with a multiplexer 198 for connection to an address generator 200. The address generator 200 is part of a logic control circuit 56 and is operable to generate addresses for output on the address bus 62. In the test mode, an address is input by raising the address pin in the test mode high for a predetermined duration of time. An internal counter in the address generator 200 determines the address by the length of the pulse on the input pin. This address is then latched to an output to the EEPROM 60 and the data during a Read mode is output, and during a Write mode is input. As described above, the purpose for accessing the EEPROM 60 external to the chip is for the purpose of uploading and downloading of data. However, the entire system could be implemented on the chip and no external access to the EEPROM 60 required.

During the calibration operation, an external temperature control 195 and temperature sensor 196 are provided. The external temperature control determines the operating temperature in the burn-in oven and is operable to generate the TEST signals, which initiate the testing operation for collecting data. During this operation, the system is initialized and a signal input to the logic control block 56. The logic control block 56 is then operable to instruct the A/D converter 52 to measure data and then this data stored in the EEPROM 60. The temperature control 195 is operable to periodically generate the measurement prompt signals to the logic control signals 56 at 23 points in the temperature range that decreases from 130° C. to 30° C. When the A/D converter 52 makes a measurement, this is stored in the first available location in the EEPROM 60. An internal counter and logic control circuit 56 increment the address such that the next measurement data is stored in the next location. As will be described hereinbelow, the information is comprised of, in part, temperature data. The temperature data provides information as to what temperature the data was measured at. At a later time, when the data is retrieved, it need only have this temperature data in order to locate the associated calibration data.

Figure 6A:
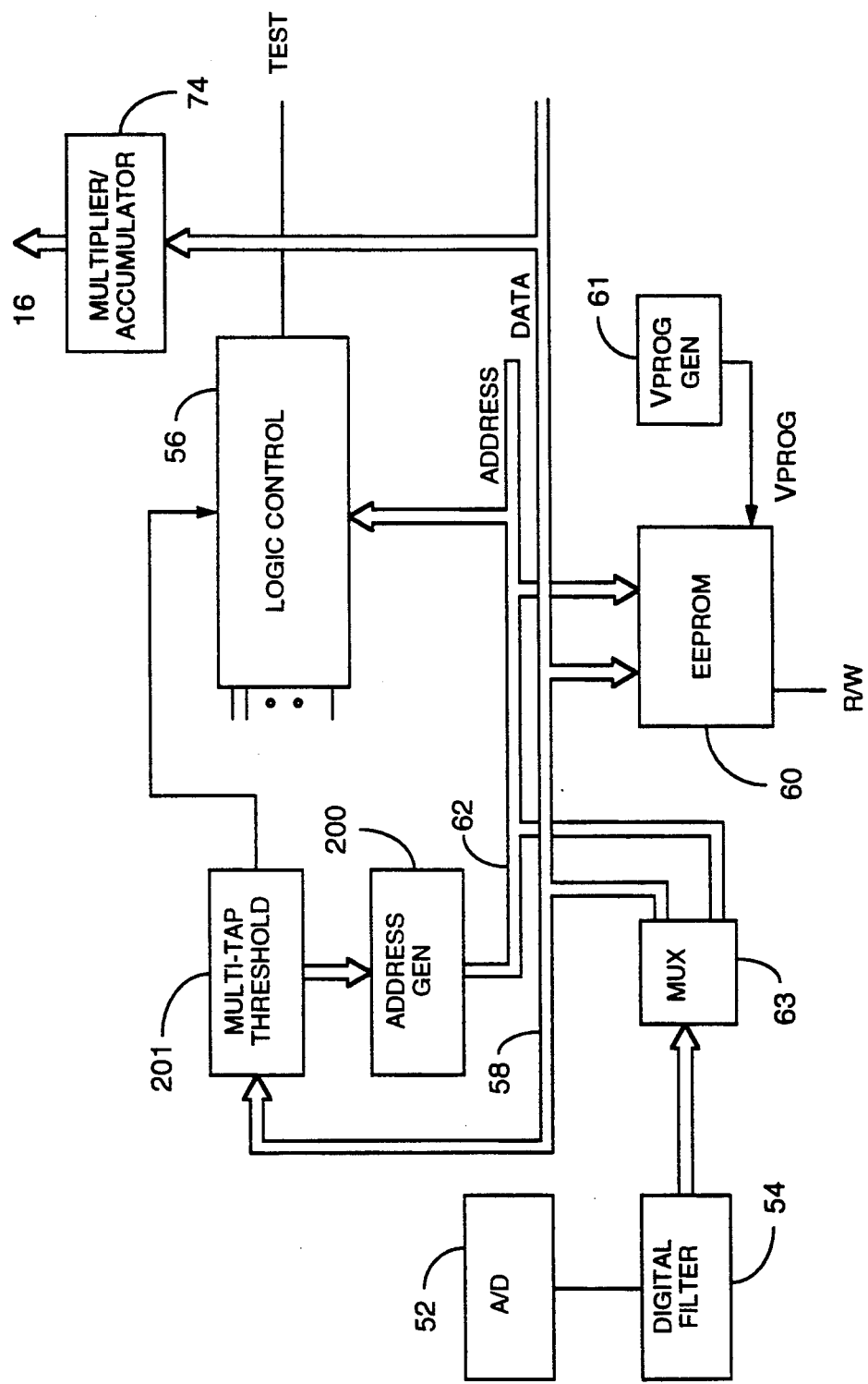

Referring now to FIG. 6a, there is illustrated an alternate embodiment of the present invention, wherein the entire calibration operation for generating the digital error voltages and digital temperature signals during the test mode and then calculating the compensation parameters for storage in the EEPROM 66 whenever the temperature traverses a predetermined temperature range and an external TEST signal is present. The compensation parameters that are stored in the EEPROM 60 are then utilized by the multiplier/accumulator 74 to generate the digital compensation word of output on the bus 16.

In operation, a multiplexer 63 is provided to receive the data output by the digital filter 54 and direct it either to the data bus 58 or the address bus 62 to provide either data or address information. In the calibration mode, a large number of temperature measurements are taken at very small increments. This is to be compared with the above described embodiment wherein only twenty-three measurements are taken. Therefore, for each temperature value, a compensation parameter will be calculated. The address at which information is stored in the EEPROM 60 corresponds to the TEMP digital value output by the digital filter 54 when measuring temperature. Therefore, during the Run operation, as will be described, it is only necessary to address the EEPROM 60 to output the compensation parameters. Further, logic control 56 is operable to generate the compensation parameters through control of the multiplier/accumulator 74 such that the digital compensation words are then stored in the EEPROM 60 as the compensation parameters during the Run operation.

When the TEST signal is present, a multi-tap threshold circuit 201 is operable to receive data from the data bus 58 and initiate a calibration operation at that temperature to determine the digital compensation word for storage in the EEPROM 60 whenever a threshold is traversed. For example, if the part traverses from 130° C. to 30° C., the digital temperature value output by the digital filter 54 will traverse one of multiple thresholds. Each threshold that is surpassed initiates a calibration operation wherein, for that temperature, a digital temperature value and the digital error voltage generated by the A/D converter 52 is input to the multiplexer/accumulator 74, and a digital compensation word calculated in accordance with the compensation algorithm associated with the multiplier/accumulator 74. This digital compensation word is then stored in the EEPROM 60 in association with the digital temperature value which initiated the calibration operation. As noted above, this can merely be an address in the EEPROM 60, which is associated with the value of the digital temperature signal output by the digital filter 50. Further, the address generator 200 can be incrementally controlled by the multi-tap threshold 201, and then both the temperature voltage and the digital compensation word stored at that address. In this mode, the Run operation would require a comparison of the value output by the digital filter 54 and the TEMP value stored in the EEPROM 60 for output of the associated digital compensation word. It can be seen that the embodiment of FIG. 6a allows for automatic generation of the digital compensation words merely by the fact that the integrated circuit or monolithic voltage reference generator traverses a certain temperature range in conjunction with the presence of a TEST signal. No external measurements are required, nor is access to the output of the digital filter 54 required nor access to the contents of the EEPROM 60 required in order to provide the compensation trim operation.

Figure 7:
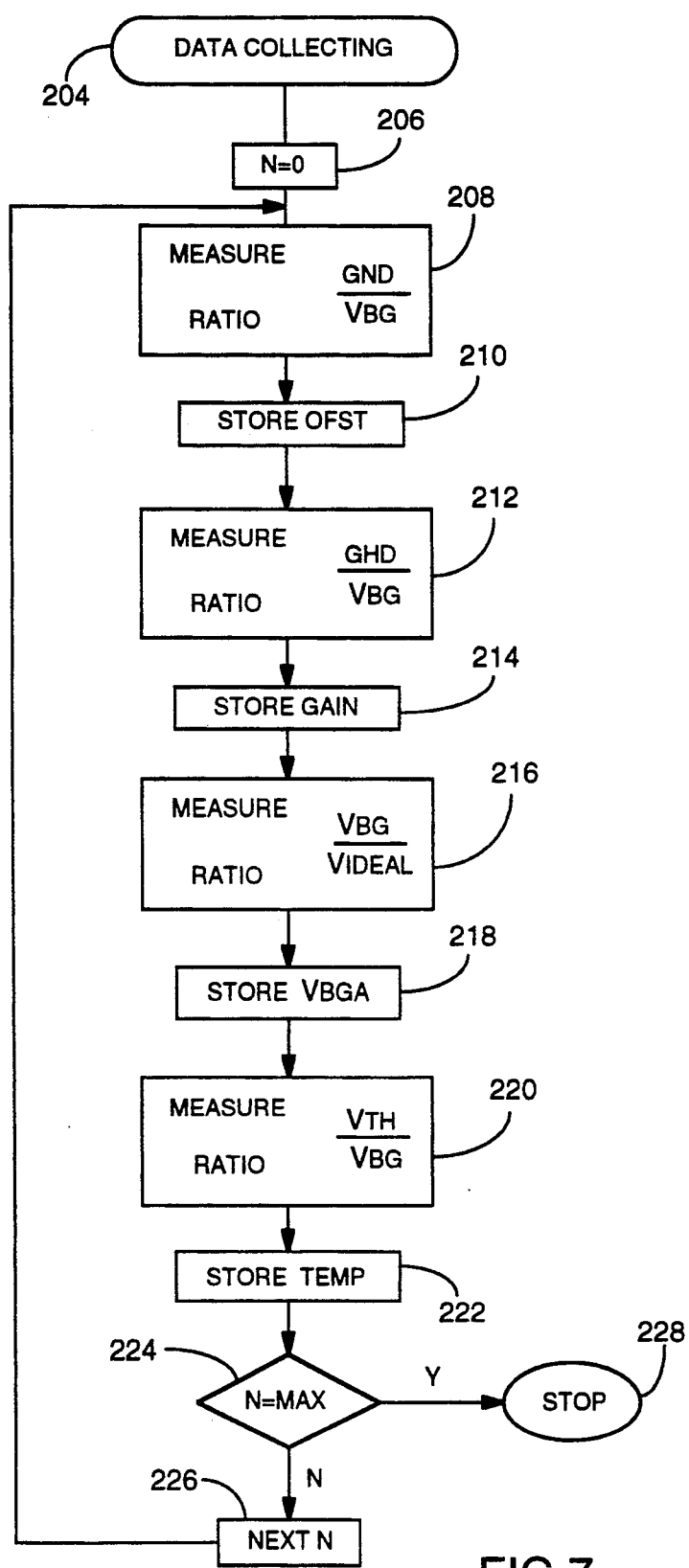
FIG. 7 illustrates a flowchart for the data collecting operation.

Referring now to FIG. 7, there is illustrated a flowchart depicting the operation of the data collection operation. In the preferred embodiment, a plurality of the chips are put through a burn-in process wherein the chips are maintained under voltage for a predetermined time at a predetermined high temperature and low temperature. However, when the test is finished, the burn-in ovens are cycled from the high temperature to room temperature and then the device is removed. During this "cooldown" procedure, the chips traverse the temperature range necessary to provide a sufficient number of temperature points at which to provide a calibration. This calibration is done during the cooldown procedure automatically by making measurements of the temperature and other parameters at each temperature increment, as provided by the temperature control 195. The temperature increments are predetermined. Initially, this technique is to be compared to a system wherein the chip must be put on a specific testing board and tested primarily for temperature, the correction factors indicated and then stored. By comparison, this technique automatically makes the calibration calculations, calculates predetermined information and stores this information in EEPROM 60, as will be described hereinbelow.

With further reference to FIG. 7, the flowchart is initiated at a start block 204 and then proceeds to a block 206 to set the initial value of N equal to zero, there being 23 values for N in the preferred embodiment. The program then flows to a function block 208 to measure the ratio of ground and $V_{UNTRIM}$, which is referred to as VBG. This comprises an offset value OFST. This measurement is facilitated with the multiplex control signal $\phi_1$. This is stored, as indicated by a function block 210, and then the program flows to a function block 212 to measure the gain with the multiplex control voltage $\phi_2$, which places the voltage $V_{UNTRIM}$ on both inputs of the delta-sigma A/D converter 52 to take the ratio of VBG over VBG. The program then stores this as GAIN in the EEPROM 60, as indicated by a function block 214. The program then flows to a function block 216 to determine an absolute voltage measurement. This is performed to the multiplex control signal $\phi_4$, which is the signal utilized to measure out the voltage. This measures the ratio of the voltage $V_{UNTRIM}$ and $V_{IDEAL}$. This is stored as a term VBGA, as indicated by a function block 218. The program then flows to a function block 220 to measure the temperature by measuring the voltage $V_{th}$ over the voltage $V_{UNTRIM}$ or VBG with the multiplex control $\phi_3$. This is stored as a variable TEMP, as indicated by a function block 222. It is important to note that when the value of TEMP is taken, the reference input of the A/D converter 52 is connected to the voltage $V_{UNTRIM}$. In this manner, the voltage signal that is output as TEMP on A/D converter 52 will be identical to the voltage output during the run operation. This is due to the fact that the $V_{UNTRIM}$ will have a temperature variation that will be repeatable. As such, the value of TEMP will act as a "tag" for the calibration data stored in the EEPROM 60. When a voltage is measured that is between two values of TEMP that are stored in the EEPROM 60, it is only necessary to extrapolate between these two voltages. In this manner, the accuracy is maintained to approximately 0.1°.

After storing the value of TEMP, the program then flows to a decision block 224 to determine if the value of N is equal to a maximum. If not, the program flows along a "N" path to a function block 226 to increment the value of N and then back to the input of the function block 208. However, when all measurements have been taken, the program flows to an End block 228 along the "Y" path. Although described as storing each of the parameters after calculation thereof, the system actually accumulates all four variables for a given value of N and then all four values are stored in the EEPROM as one 64-bit word in four 16-bit blocks. It is important to note that the data has been automatically taken during a cooldown procedure and stored in the EEPROM 60. This is utilized in a later final test for calculating the correction parameters and restoring the correction parameters in the EEPROM 60. The EEPROM 60 therefore contains a temperature history of the chip, which can comprise temperature compensation parameters or anything temperature related. Further, the calibration parameters could be calculated on chip during the cooldown procedure and only the correction facts stored in the EEPROM.

Figure 8:
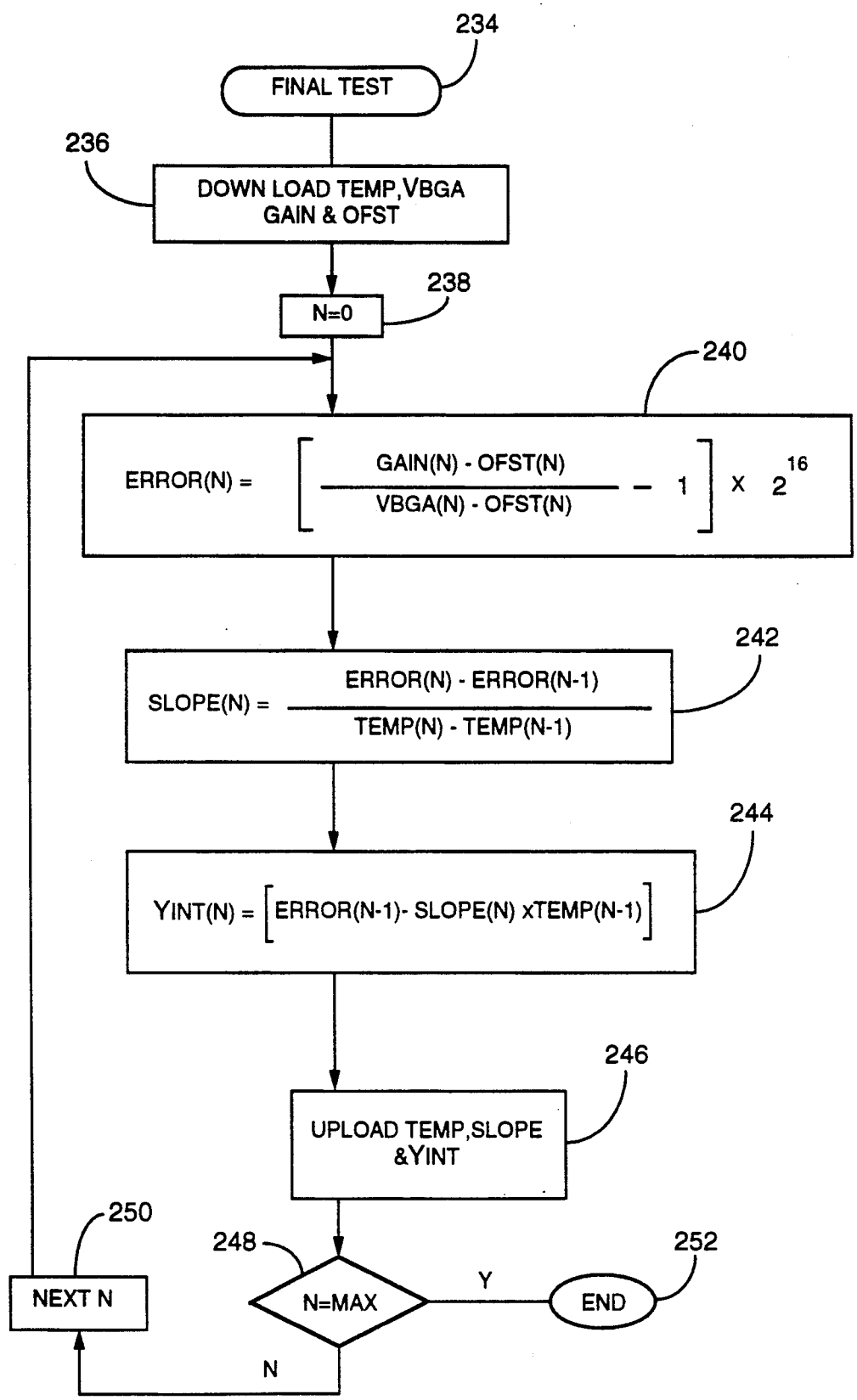
FIG. 8 illustrates a flowchart for the final test operation to generate the correction factors for storage in the E²PROM.

Referring now to FIG. 8, there is illustrated a flowchart depicting the operation of the final test, which is initiated at a start block 234. After the part has been removed from the burn-in oven, the program flows to a function block 236 to download the variables TEMP, VBGA, GAIN and OFST. The program then flows to a function block 238 to set the value of N equal to zero and there to a function block 240 to calculate the error value, which is essentially the offset value of GAIN divided by the offset value of VBGA multiplied by $2^{16}$ after a value of 1 is subtracted therefrom. The program then flows to a function block 242 to calculate the value of the slope for N. This is equal to the difference in the error values for N and N−1 divided by the difference in temperature for TEMP(N) and TEMP(N−1). The program then flows to a function block 244 to calculate the y-intercept. The y-intercept is equal to the difference between the error for the value of N−1 and the product of the slope for N and the TEMP for N−1. The program then flows to a function block 246 to upload the values of TEMP, SLOPE and y-intercept. The program then flows to a decision block 248 to determine if the value of N is equal to a maximum. If not, the program flows through a function block 250 to increment the value and then back to the input of function block 240. Once all calculations are done, the program flows to an End block 252.

Figure 9:
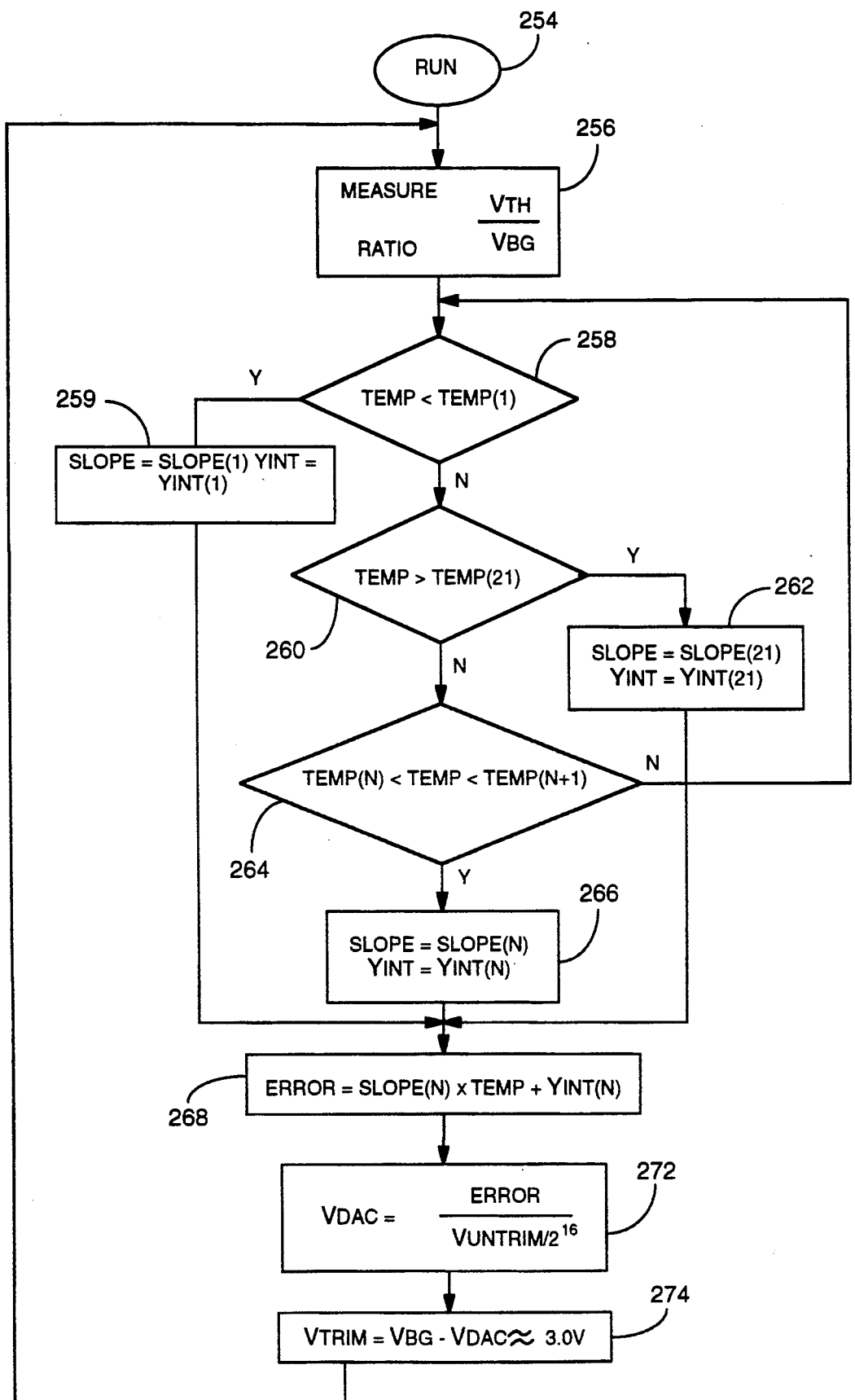
FIG. 9 illustrates a flowchart for the temperature compensation operation.

Referring now to FIG. 9, there is depicted a flowchart of the run operation, which is initiated at a start block 254 and then proceeds to a function block 256 to measure the ratio of the temperature voltage $V_{th}$ and the untrimmed voltage VBG. The program then flows to a decision block 258 to determine if the value of TEMP is less than the value of TEMP(1), indicating that this is the first point on the curve. If so, Slope and $Y_{INTERCEPT}$ are set equal to the value of Slope and $Y_{INTERCEPT}$ provided for N=1, as indicated by block 259. If not, the program flows to a decision block 260 to determine if the value of TEMP is greater than TEMP(21), which is the endpoint of the curve. If so, the program flows to a function block 262 to reset the value of the slope and $Y_{INTERCEPT}$ equal to that for N=21. If the value of TEMP is not less than the lower boundary or greater than the upper boundary, the program flows to a decision block 264 to determine if the TEMP is between TEMP(N) and TEMP(N+1). If not, the program turns back to the input of decision block 258 to determine again where the value of TEMP is. However, if the value of TEMP is between these ranges, the program flows to a function block 266 to set the value of the Slope and $Y_{INTERCEPT}$ equal to the slope for the value of N. The output of function blocks 259, 262 and 266 flows to a function block 268.

In function block 268, the value of ERROR is determined, which is equal to the product of Slope(N) and TEMP summed with the intercept value for N. The program then flows to a function block 272 to calculate the value of $V_{DAC}$, which is the ERROR value divided by the term $V_{UNTRIM}/2^{16}$, the ERROR value varying in increments of 50 μV for each of $2^{16}$ segments. The program then flows to a function block 274 to calculate the value of $V_{TRIM}$, which is the difference between the output VBG($V_{UNTRIM}$) and $V_{DAC}$. The program then flows back to the input of function block 256 and cycles through this program at fixed time intervals of 200 mS.

During this normal operation, the delta-sigma converter is locked into the mode corresponding to the multiplex control signal $\phi_3$, with the measurements taken at the fixed time intervals of 200 mS. If the temperature changes, the digital multiplier/accumulator circuitry 74 chooses the correct temperature segment based on the delta-sigma output word and performs the calculation using slope and intercept information for the segment of interest. The result of this calculation controls the reference trim DAC 76, which adjusts the error voltage so that the trimmed reference voltage is always correct.

Figure 10:
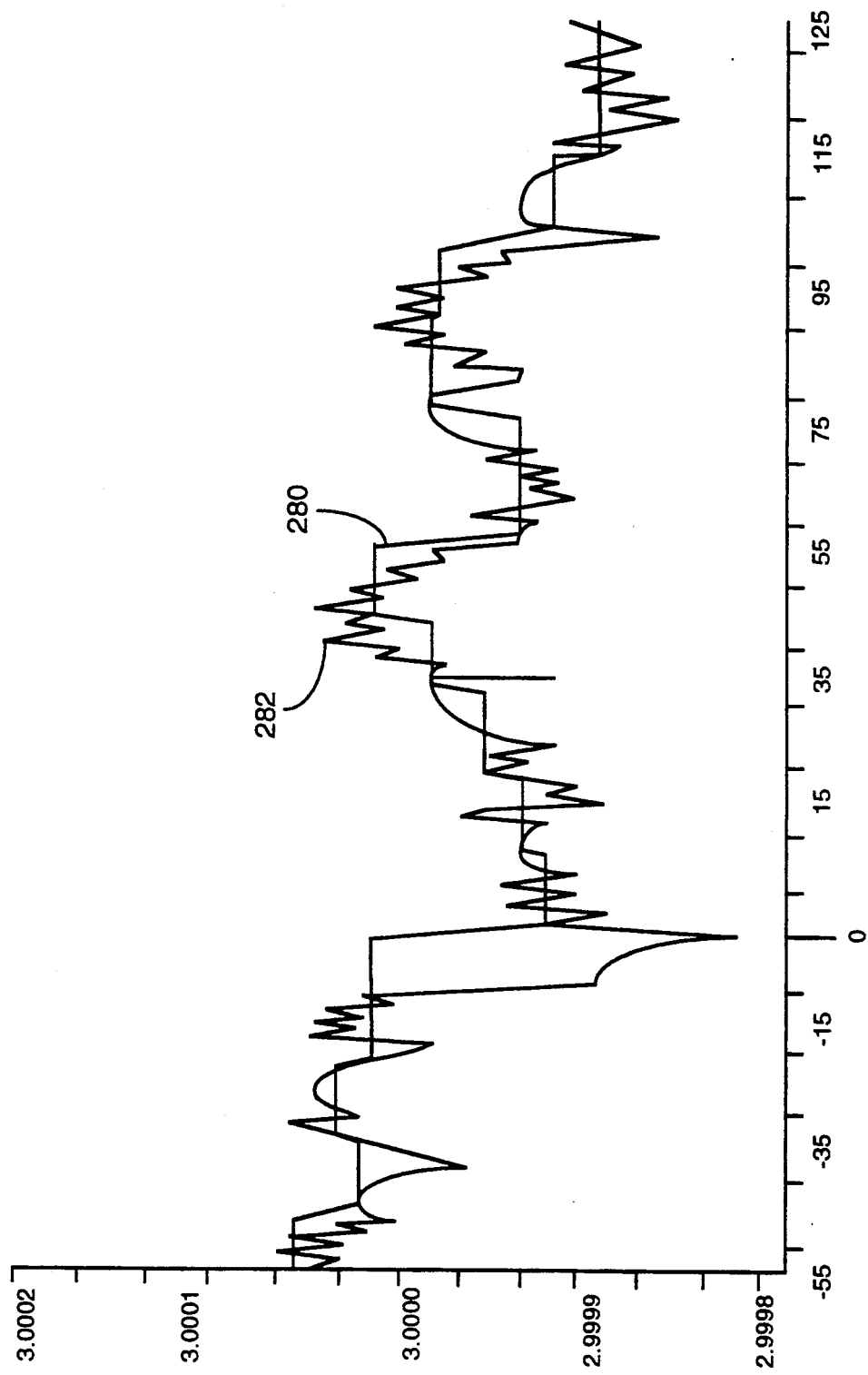
FIG. 10 illustrates a comparison plot of the segmented DAC output with hysteresis and with no hysteresis.

Referring now to FIG. 10, there is illustrated a plot the corrected output voltage $V_{TRIM}$ for two conditions, one without hysteresis and one with hysteresis. The hysteresis curve is illustrated by a curve 280 and the curve without hysteresis is represented by a curve 282. Hysteresis solves a problem that exists with a fixed time correction. For example, if a temperature of the integrated circuit is at a temperature exactly on the boundary of two possible DAC trim codes, the trimmed reference could have a square wave of 1 LSB of DAC trim (±50 μV) at a 5 Hz frequency relying on the 3.0 volt voltage. This would result in the curve 282. In the preferred embodiment, a digital hysteresis algorithm is implemented on the integrated circuit so that the reference trim DAC must change by a fixed number of LSBs, that number being greater than one, before the voltage reference is trimmed. In the preferred embodiment, the value of the hysteresis is set to five, such that this is the number of LSBs that must be changed before the DAC trim output is changed. This reduces the apparent number of steps in the reference voltage for small temperature deviations.

During calibration, an external reference voltage standard is used to obtain the absolute value of the untrimmed voltage reference $V_{UNTRIM}$ during the presence of the $\phi_4$ control signal to the multiplexer. Since this external voltage is connected to every integrated circuit in the burn-in oven, a large length of printed circuit board is necessary. The burn-in oven environment is one in which the presence of unwanted 60 Hz line of frequency interface cannot be avoided. The reading of the external voltage standard only adds to the problem of 60.0 Hz line frequency interference.

In order to solve this problem, an inverse delta-sigma conversion is performed during the period corresponding to the presence of signal $\phi_4$. Normally, the external voltage standard would be connected to the delta-sigma reference input and the untrimmed voltage $V_{UNTRIM}$ connected to the delta-sigma signal input. With the present embodiment, the opposite is true. It is done this way to take advantage of the attenuation that the digital filter has on the delta-sigma signal input. Zeroes of the digital filter 54 are placed at 5 Hz multiples so that any 50 Hz or 60 Hz line interference present on the external voltage standard is severely attenuated by the digital filter 54 and does not corrupt the measurement. This "inverse" conversion is simply taken care of by the tester when the slopes and y-intercept values are calculated for each segment.

In summary, there has been provided a method for continuously calibrating the operation of an analog-to-digital converter by compensating the analog reference input voltage thereto. The method includes the step of trimming an on-chip analog reference voltage generator such as a bandgap reference circuit. A secondary analog-to-digital converter is utilized to compare the untrimmed voltage to an ideal voltage and also to compare the untrimmed voltage to a temperature voltage. This information is utilized to generate calibration parameters. These calibration parameters are calculated during a burn-in procedure wherein the temperature internal to the chip is varied. During this variation of temperature, the calibration parameters necessary to correct the untrimmed voltage for temperature are determined and stored in a non-volatile memory. During running of the chip, temperature is measured and the appropriate calibration parameter retrieved from the non-volatile memory and utilized to generate a digital compensation word, which is utilized to control an analog trim circuit to trim the voltage.

Although the preferred embodiment has been described in detail, it should be understood that various changes, substitutions and alterations can be made therein without departing from the spirit and scope of the invention as defined by the appended claims.

What is claimed is:

1. A monolithic analog-to-digital converter, comprising:

a primary analog-to-digital converter for receiving an analog input signal and converting the analog input signal to a digital output signal corresponding to the analog input signal;

an analog environmental parameter measuring device for measuring predetermined environmental parameters associated with the operation of said primary analog-to-digital converter, and for generating analog environmental information corresponding to the measured environmental parameters;

a secondary analog-to-digital converter for converting said analog environmental information to digital environmental information;

a non-volatile memory for storing digital compensation parameters associated with said digital environmental information; and a compensation device for accessing select ones of said digital compensation parameters from said memory corresponding to said digital environmental information output by said secondary analog-to-digital converter and compensating the operation of said primary analog-to-digital converter in accordance with select digital compensation parameters and a predetermined compensation algorithm.

2. The monolithic analog-to-digital converter of claim 1, wherein said compensation device is operable to compensate the operation of said primary analog-to-digital converter in the digital domain in accordance with the select digital compensation parameters and the predetermined compensation algorithm.

3. The monolithic analog-to-digital converter of claim 2, wherein:
said primary analog-to-digital converter includes a reference voltage generator for generating an uncompensated analog voltage;
said predetermined environmental parameters comprise temperature parameters;
said compensation device is operable to compensate the operation of said primary analog-to-digital converter with said uncompensated analog voltage input as an analog reference thereto, such that temperature variations of said uncompensated analog voltage from a predetermined voltage ideal are compensated for in accordance with said predetermined compensation algorithm, said digital compensation parameters stored in said non-volatile memory corresponding to the compensation necessary to account for variations in said uncompensated analog voltage as a function of temperature.

4. The monolithic analog-to-digital converter of claim 1, wherein:
said primary analog-to-digital converter includes a reference voltage generator for generating an uncompensated analog voltage;
said predetermined environmental parameters comprise temperature parameters; and
said compensation device is operable to compensate said uncompensated analog voltage generated by said reference voltage to output a compensated analog voltage for input to said primary analog-to-digital converter as a reference.

5. The monolithic analog-to-digital converter of claim 2, wherein said compensation device comprises:
a compensation processor for accessing the select ones of said digital compensation parameters from said memory corresponding to said digital environmental information output by said secondary analog-to-digital converter, said processor operable to process said selected digital compensation parameters in accordance with said predetermined compensation algorithm to output a digital compensation word that corresponds to said analog environmental information; and
a compensation circuit for receiving said digital compensation word and compensating uncompensated analog voltage in accordance with said digital compensation word.

6. The monolithic analog-to-digital converter of claim 1, wherein said analog environmental parameter measuring device comprises a temperature monitor co-located with a reference voltage generator and said primary analog-to-digital converter for measuring the temperature thereof, to provide an analog temperature signal, the output of said secondary analog-to-digital converter comprising a digital temperature signal.

7. The analog-to-digital converter of claim 1, and further comprising a calibration device for measuring the operation of said primary analog-to-digital converter as a function of said predetermined environmental parameters and generating information corresponding to said digital compensation parameters stored in said non-volatile memory.

8. A monolithic analog-to-digital converter comprising:
a primary analog-to-digital converter for receiving an analog input and a compensated analog voltage and outputting a digital output signal corresponding to said analog input signal;
a reference voltage generator for generating an uncompensated analog voltage;
an environmental parameter measuring device co-located with said reference voltage generator for measuring predetermined environmental parameters associated with said reference voltage generator, and for generating an analog environmental signal corresponding to the measured predetermined environmental parameters;
a secondary analog-to-digital converter for converting said analog environmental signal to a digital environmental signal;
a non-volatile memory for storing digital compensation parameters associated with each value of said digital environmental signal;
a compensation processor for retrieving select ones of said digital compensation parameters from said memory, said select digital compensation parameters corresponding to said digital environmental signal output by said secondary analog-to-digital converter, said processor operable to process said select digital compensation parameters in accordance with a predetermined compensation algorithm to output a digital compensation word; and
a compensation circuit for receiving said digital compensation word and compensating said uncompensated analog voltage in accordance with the value of said digital compensation word.

9. The monolithic analog-to-digital converter of claim 8, wherein:
said environmental parameters comprise temperature parameters;
said analog environmental signal comprises an analog temperature signal that is proportioned to absolute temperature; and
said ditital environmental signal comprises a digital temperature signal.

10. The monolithic analog-to-digital converter of claim 9, and further comprising:
test control circuitry for controlling said secondary analog-to-digital converter to measure the response of said uncompensated analog voltage as a function of temperature at a plurality of temperatures to output for each measured temperature a digital temperature signal and an associated digital error voltage signal and store at each measured temperatures said associated digital temperature signal and digital error voltage signal in said memory, said digital error voltage signal operable to be converted into said compensation parameters for each of said digital temperature signals.

11. The monolithic analog-to-digital converter of claim 10, wherein said test control circuitry operates in response to an external measurement prompt signal to initiate output of said digital temperature signal and associated digital error voltage signal and for storing the values thereof in said memory.

12. The analog-to-digital converter of claim 10, wherein said secondary analog-to-digital converter further comprises a multiplexer on the input thereof for receiving an external reference voltage standard, said uncompensated analog voltage and said analog temperature signal, said multiplexer operating in a test mode under control of said test control circuitry to provide a digital value representing the ratio of said external reference voltage and said uncompensated analog voltage, and a digital value representing the ratio of a reference voltage and said analog temperature voltage, said multiplexer operating in a run mode to provide as said digital temperature signal a digital value representing the ratio of said reference voltage and said analog temperature signal.

13. The monolithic analog-to-digital converter of claim 12, wherein said reference voltage is said uncompensated analog voltage.

14. The monolithic analog-to-digital converter of claim 12, and further comprising, access circuitry for accessing said non-volatile memory to download data therefrom.

* * * * *

UNITED STATES PATENT AND TRADEMARK OFFICE
CERTIFICATE OF CORRECTION

PATENT NO. : 5,319,370
DATED : June 7, 1994
INVENTOR(S) : Del Signore, et al.

It is certified that error appears in the above-indentified patent and that said Letters Patent is hereby corrected as shown below:

On the title page, item [75]:

The last name of the first inventor is --Del Signore-- not "Signore."

Column 8, line 18, replace "substract" with --subtract--.

Column 18, Claim 9, line 44, replace "ditital" with --digital--.

Signed and Sealed this

Twenty-fifth Day of October, 1994

Attest:

BRUCE LEHMAN

Attesting Officer

Commissioner of Patents and Trademarks